(12) United States Patent
Zhong et al.

(10) Patent No.: US 11,190,010 B2
(45) Date of Patent: Nov. 30, 2021

(54) ANNULAR BEARER NETWORK AND SERVICE BEARING IMPLEMENTATION METHOD THEREFOR

(71) Applicants: GUANGDONG POWER GRID CO., LTD., Guangdong (CN); ELECTRIC POWER RESEARCH INSTITUTE OF GUANGDONG POWER GRID CO., LTD., Guangdong (CN)

(72) Inventors: Lianhong Zhong, Guangdong (CN); Xinhui Duan, Guangdong (CN); Meng Song, Guangdong (CN); Chao Sheng, Guangdong (CN); Bing Zhao, Guangdong (CN); Li Li, Guangdong (CN); Yunsong Luo, Guangdong (CN); Yajun Xia, Guangdong (CN); Wenfeng Cheng, Guangdong (CN); Zhengjun Shi, Guangdong (CN); Xiaoqing Xiao, Guangdong (CN); Youxin Lin, Guangdong (CN)

(73) Assignees: Guangdong Power Grid Co. Ltd., Guangdong (CN); China Electric Power Research Institute of Guangdong Power Grid Co., Ltd., Guangdong (CN)

( * ) Notice: Subject to any disclaimer, the term of this patent is extended or adjusted under 35 U.S.C. 154(b) by 0 days.

(21) Appl. No.: 16/972,503

(22) PCT Filed: Aug. 27, 2019

(86) PCT No.: PCT/CN2019/102668
§ 371 (c)(1),
(2) Date: Dec. 4, 2020

(87) PCT Pub. No.: WO2020/043073
PCT Pub. Date: Mar. 5, 2020

(65) Prior Publication Data
US 2021/0273446 A1 Sep. 2, 2021

(30) Foreign Application Priority Data
Aug. 27, 2018 (CN) .......................... 201810983056.1

(51) Int. Cl.
*H02H 9/02* (2006.01)
*H01L 39/16* (2006.01)
(Continued)

(52) U.S. Cl.
CPC ............. *H02H 9/023* (2013.01); *H01L 39/16* (2013.01); *H02H 9/02* (2013.01); *H01H 9/54* (2013.01);
(Continued)

(58) Field of Classification Search
CPC ............ H02H 9/02; H02H 9/023; H02H 7/00; H02H 9/00; H02H 9/08; H02H 7/26;
(Continued)

(56) References Cited

U.S. PATENT DOCUMENTS

| 2010/0177450 | A1* | 7/2010 | Holcomb | H02H 9/023 361/19 |
| 2019/0199089 | A1* | 6/2019 | Loume | H02H 1/0007 |

FOREIGN PATENT DOCUMENTS

| CN | 101373895 | 2/2009 |
| CN | 101741076 | 6/2010 |

(Continued)

OTHER PUBLICATIONS

CN201810983056.1 First Office Action dated Apr. 24, 2019 with translation.
(Continued)

*Primary Examiner* — Danny Nguyen
(74) *Attorney, Agent, or Firm* — Michael Best & Friedrich LLP (57) ABSTRACT

Provided are a method and apparatus for calculating fault resistance and a current-limiting current of a superconduct-
(Continued)

ing fault current limiter. The method includes: calculating a first short-circuit fault current $I_n(t)$ of a power grid short-circuit fault transient circuit; calling an external characteristic model $U(I,t)$, and calculating resistance $R_n(t)$ of a superconducting fault current limiter under the first short-circuit fault current $I_n(t)$; adding the resistance $R_n(t)$ of the superconducting fault current limiter into the power grid short-circuit fault transient circuit, and calculating a second short-circuit fault current $I_m(t)$, where m=n+1; and determining whether an error between the second short-circuit fault current $I_m(t)$ and the first short-circuit fault current $I_n(t)$ is smaller than a preset threshold value, if yes, determining the fault resistance and the current-limiting current of the superconducting fault current limiter to be $R_n(t)$ and $I_m(t)$ respectively; otherwise, $I_n(t)=I_m(t)$, returning for iteration.

12 Claims, 6 Drawing Sheets

(51) Int. Cl.
　　　*H01H 9/54*　　　(2006.01)
　　　*H02H 7/26*　　　(2006.01)
　　　*H02H 9/08*　　　(2006.01)
　　　*H02H 1/00*　　　(2006.01)
(52) U.S. Cl.
　　　CPC ........... *H01H 9/547* (2013.01); *H02H 1/0007* (2013.01); *H02H 7/26* (2013.01); *H02H 9/08* (2013.01)

(58) Field of Classification Search
　　　CPC ....... H02H 1/0007; H01L 39/16; H01L 39/02; H01L 39/24; H02J 3/36; H01H 9/54; H01H 9/548; H01H 9/547; H01H 39/02
　　　USPC .................................... 361/19; 505/150, 163
　　　See application file for complete search history.

(56) References Cited

FOREIGN PATENT DOCUMENTS

| | | |
|---|---|---|
| CN | 102362467 | 2/2012 |
| CN | 105160047 | 12/2015 |
| CN | 108923401 | 11/2018 |
| DE | 102016223022 | 3/2018 |
| WO | 20180054614 | 3/2018 |

OTHER PUBLICATIONS

Gong Jun, "Analysis of Transient Resistance Characteristics for Resistive Type High Temperature Superconducting Fault Current Limiter", Transactions of China Electrotechnical Society, May 2018, vol. 33, No. 9, Beijing, China.
PCT/CN2019/102668 International Search Report dated Dec. 9, 2019.

* cited by examiner

FIG. 11 ically to a method and apparatus for calculating fault resistance and a current-limiting current of a superconducting fault current limiter.

ANNULAR BEARER NETWORK AND SERVICE BEARING IMPLEMENTATION METHOD THEREFOR

This application is a National Stage Application, filed under 35 U.S.C. 371, of International Patent Application No. PCT/CN2019/102668, filed on Aug. 27, 2019, which claims priority to Chinese Patent Application No. 201810983056.1, entitled "METHOD AND APPARATUS FOR CALCULATING FAULT RESISTANCE AND A CUT-OFF CURRENT OF A SUPERCONDUCTING FAULT CURRENT LIMITER", filed with the CNIPA on Aug. 27, 2018, contents of both of which are incorporated herein by reference in their entireties.

TECHNICAL FIELD

The present disclosure relates to the technical field of superconducting fault current limiters, and particularly to a method and apparatus for calculating fault resistance and a current-limiting current of a superconducting fault current limiter.

BACKGROUND

At present, researchers at home and abroad have done a lot of related work in the research of superconducting fault current limiters. Among the superconducting fault current limiters, a resistive type superconducting fault current limiter has a broader research prospect because it has a relatively simple structure, can easily be implemented in technology, can be enhanced in terms of voltage level, and can be conveniently installed and maintained in the circuitry.

At present, the research on the resistive type superconducting fault current limiter mainly focuses on the design of the body structure and circuit topology of the current limiter. However, the transient characteristic of the quench of superconductivity of a superconducting material due to a short-circuit current in the superconducting fault current limiter is still the core content that affects the current limiting capability of the superconducting fault current limiter and the protection of the current limiter. For the resistive type superconducting fault current limiter, a transient change process of the current limiting impedance of the superconducting material generated in a short-circuit fault determines the current limiting adaptability of the current limiter in a power system. Therefore, basic parameters for the design of a resistive type superconducting fault current limiter include fault resistance and a current-limiting current of the resistive type superconducting fault current limiter of a certain topology and structure type which are determined under a specific impact current.

The current method to determine the fault resistance and current-limiting current of the resistive type superconducting fault current limiter is as described below. Critical current characteristics of a second generation high-temperature superconducting material are analyzed to establish a mathematical simulation model of the high-temperature superconducting material, and joint simulation is carried out through PSCAD/EMTDC and MATLAB software. Operation characteristics of the superconducting fault current limiter for single-phase short-circuiting and three-phase short-circuiting faults in a simple power system are simulated and analyzed, and the results are compared. Finally, quench resistance under the impact of a large current is measured to verify the correctness of a transient current limiting resistance calculation model and test system. However, the existing method cannot accurately determine the fault resistance and current-limiting current of a resistive type superconducting fault current limiter of a characteristic topology and structure type under a certain impact current. Only through verification may the obtained values be proved to satisfy the requirements, and no optimal scheme is obtained.

SUMMARY

A method and apparatus for calculating fault resistance and a current-limiting current of a superconducting fault current limiter are provided in the present disclosure.

A method for calculating fault resistance and a current-limiting current of a superconducting fault current limiter is provided in the present disclosure and includes steps described below.

Step S1: A power grid short-circuit fault transient circuit including the superconducting fault current limiter is called, and a first short-circuit fault current $I_n(t)$ of the power grid short-circuit fault transient circuit in a case where the superconducting fault current limiter fails to respond to a short-circuit fault is calculated, where n is a natural number.

Step S2: An external characteristic model $U(I, t)$ of the superconducting fault current limiter under different heat exchange conditions and under an action of different impact currents is called, and resistance $R_n(t)$ of the superconducting fault current limiter under an action of the first short-circuit fault current $I_n(t)$ is calculated.

Step S3: The resistance $R_n(t)$ of the superconducting fault current limiter is added into the power grid short-circuit fault transient circuit, and a second short-circuit fault current $I_m(t)$ of the power grid short-circuit fault transient circuit is calculated, where m=n+1.

Step S4: It is determined whether an error between the second short-circuit fault current $I_m(t)$ and the first short-circuit fault current $I_n(t)$ is smaller than a preset threshold value, if yes, the fault resistance and the current-limiting current of the superconducting fault current limiter are determined to be $R_n(t)$ and $I_m(t)$ respectively; and if not, after $I_n(t)=I_m(t)$, the process returns to the step S2 for iteration.

In an embodiment, before the step S1, the method further includes steps described below.

Step S01: A resistance model $R(T)$ of the superconducting fault current limiter at different temperatures is established, where R is a resistance value of the superconducting fault current limiter in units of $\Omega$, and T is a conductor temperature of the superconducting fault current limiter in units of K.

Step S02: The resistance model $R(T)$ is called, and the external characteristic model $U(I, t)$ of the superconducting fault current limiter under the different heat exchange conditions and different impact currents is established by combining the resistance model $R(T)$.

In an embodiment, before the step S1, the method further includes a step described below.

The power grid short-circuit fault transient circuit including the superconducting fault current limiter is established.

In an embodiment, the error between the second short-circuit fault current $I_m(t)$ and the first short-circuit fault current $I_n(t)$ in the step S4 is specifically expressed by:

$$\frac{|I_m(t) - I_n(t)|}{|I_n(t)|}.$$

An apparatus for calculating fault resistance and a current-limiting current of a superconducting fault current limiter is provided in the present disclosure and includes a first calculation unit, a second calculation unit, a third calculation unit, and a determination unit.

The first calculation unit is configured to call a power grid short-circuit fault transient circuit including the superconducting fault current limiter, and calculate a first short-circuit fault current $I_n(t)$ of the power grid short-circuit fault transient circuit in a case where the superconducting fault current limiter fails to respond to a short-circuit fault, where n is a natural number.

The second calculation unit is configured to call an external characteristic model $U(I, t)$ of the superconducting fault current limiter under different heat exchange conditions and under an action of different impact currents, and calculate resistance $R_n(t)$ of the superconducting fault current limiter under an action of the first short-circuit fault current $I_n(t)$.

The third calculation unit is configured to add the resistance $R_n(t)$ of the superconducting fault current limiter into the power grid short-circuit fault transient circuit, and calculate a second short-circuit fault current $I_m(t)$ of the power grid short-circuit fault transient circuit, where m=n+1.

The determination unit is configured to determine whether an error between the second short-circuit fault current $I_m(t)$ and the first short-circuit fault current $I_n(t)$ is smaller than a preset threshold value, if yes, determine the fault resistance and the current-limiting current of the superconducting fault current limiter to be $R_n(t)$ and $I_m(t)$ respectively; and if not, after $I_n(t)=I_m(t)$, determine to return to the second calculation unit for iteration.

In an embodiment, the apparatus further includes a first establishment unit and a second establishment unit.

The first establishment unit is configured to establish a resistance model $R(T)$ of the superconducting fault current limiter at different temperatures, where R is a resistance value of the superconducting fault current limiter in units of Ω, and T is a conductor temperature of the superconducting fault current limiter in units of K.

The second establishment unit is configured to call the resistance model $R(T)$, and establish, by combining the resistance model $R(T)$, the external characteristic model $U(I, t)$ of the superconducting fault current limiter under the different heat exchange conditions and different impact currents.

In an embodiment, the apparatus further includes a third establishment unit.

The third establishment unit is configured to establish the power grid short-circuit fault transient circuit including the superconducting fault current limiter.

In an embodiment, the error between the second short-circuit fault current $I_m(t)$ and the first short-circuit fault current $I_n(t)$ in the determination unit is specifically expressed by:

$$\frac{|I_m(t) - I_n(t)|}{|I_n(t)|}.$$

A device for calculating fault resistance and a current-limiting current of a superconducting fault current limiter is provided in the present disclosure and includes a processor and a memory.

The memory is configured to store program codes and transmit the program codes to the processor.

The processor is configured to execute any above-mentioned method for calculating fault resistance and a current-limiting current of a superconducting fault current limiter according to instructions in the program codes.

A computer-readable storage medium is provided in the present disclosure and is configured to store program codes for executing any above-mentioned method for calculating fault resistance and a current-limiting current of a superconducting fault current limiter.

A method for calculating fault resistance and a current-limiting current of a superconducting fault current limiter is provided in the present disclosure. The method includes: step S1: calling a power grid short-circuit fault transient circuit including the superconducting fault current limiter, and calculating a first short-circuit fault current $I_n(t)$ of the power grid short-circuit fault transient circuit in a case where the superconducting fault current limiter fails to respond to a short-circuit fault, where n is a natural number; step S2: calling an external characteristic model $U(I, t)$ of the superconducting fault current limiter under different heat exchange conditions and under an action of different impact currents, and calculating resistance $R_n(t)$ of the superconducting fault current limiter under an action of the first short-circuit fault current $I_n(t)$; step S3: adding the resistance $R_n(t)$ of the superconducting fault current limiter into the power grid short-circuit fault transient circuit, and calculating a second short-circuit fault current $I_m(t)$ of the power grid short-circuit fault transient circuit, where m=n+1; and step S4: determining whether an error between the second short-circuit fault current $I_m(t)$ and the first short-circuit fault current $I_n(t)$ is smaller than a preset threshold value, if yes, determining the fault resistance and the current-limiting current of the superconducting fault current limiter to be $R_n(t)$ and $I_m(t)$ respectively; and if not, after $I_n(t)=I_m(t)$, returning to the step S2 for iteration.

DETAILED DESCRIPTION

In the related art, the existing method cannot accurately determine the fault resistance and current-limiting current of a resistive type superconducting fault current limiter of a characteristic topology and structure type under a certain impact current; and only through verification may the obtained values be proved to satisfy the requirements, and no optimal scheme is obtained. In view of the above, A method and apparatus for calculating fault resistance and current-limiting current of a superconducting fault current limiter are provided in the embodiments of the present disclosure.

To make the purposes, features, and advantages of the present disclosure more apparent and easier to understand, the embodiments of the present disclosure will be described clearly and completely in conjunction with the drawings in the embodiments of the present disclosure. Apparently, the embodiments described below are part, not all of the embodiments of the present disclosure. Based on the embodiments of the present disclosure, all other embodiments obtained by those of ordinary skill in the art without any creative work are within the scope of the present disclosure.

Figure 1:
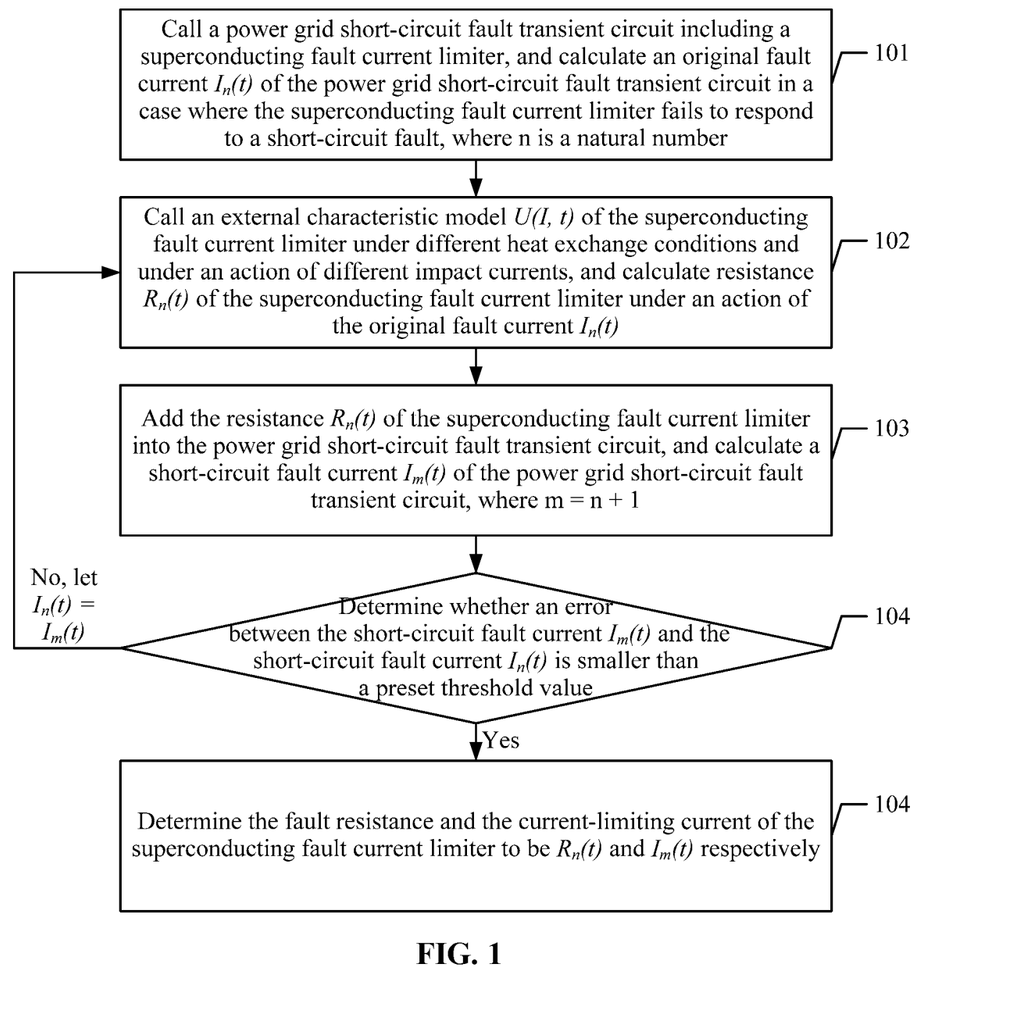
FIG. 1 illustrates a flowchart of a method for calculating fault resistance and a current-limiting current of a superconducting fault current limiter according to an embodiment of the present disclosure.

Referring to FIG. 1, a method for calculating fault resistance and a current-limiting current of a superconducting fault current limiter is provided in an embodiment of the present disclosure and includes steps described below.

Step 101: A power grid short-circuit fault transient circuit including the superconducting fault current limiter is called, and a first short-circuit fault current $I_n(t)$ of the power grid short-circuit fault transient circuit in a case where the superconducting fault current limiter fails to respond to a short-circuit fault is calculated, where n is a natural number.

Step 102: An external characteristic model U(I, t) of the superconducting fault current limiter under different heat exchange conditions and under an action of different impact currents is called, and resistance $R_n(t)$ of the superconducting fault current limiter under an action of the first short-circuit fault current $I_n(t)$ is calculated.

Step 103: The resistance $R_n(t)$ of the superconducting fault current limiter is added into the power grid short-circuit fault transient circuit, and a second short-circuit fault current $I_m(t)$ of the power grid short-circuit fault transient circuit is calculated, where m=n+1.

Step 104: It is determined whether an error between the second short-circuit fault current $I_m(t)$ and the first short-circuit fault current $I_n(t)$ is smaller than a preset threshold value, if yes, the fault resistance and the current-limiting current of the superconducting fault current limiter are determined to be $R_n(t)$ and $I_m(t)$ respectively; and if not, after $I_n(t)=I_m(t)$, the process returns to the step 102 for iteration.

According to an interactive relationship between a fault current and a current-limiting current of the superconducting fault current limiter under the action of a large impact current, the embodiment of the present disclosure can accurately determine, through the iterative method and under given convergence conditions, the values of fault resistance and current-limiting current of the superconducting fault current limiter under the specific large impact current. The embodiment of the present disclosure provides a scheme for determining the basic parameters of the superconducting fault current limiter, lays a foundation for ensuring the current limiting effect of the superconducting fault current limiter.

The above is a description of the method for calculating fault resistance and a current-limiting current of a superconducting fault current limiter in an embodiment of the present disclosure, and the following is a description of a method for calculating fault resistance and a current-limiting current of a superconducting fault current limiter in another embodiment of the present disclosure.

Figure 2:
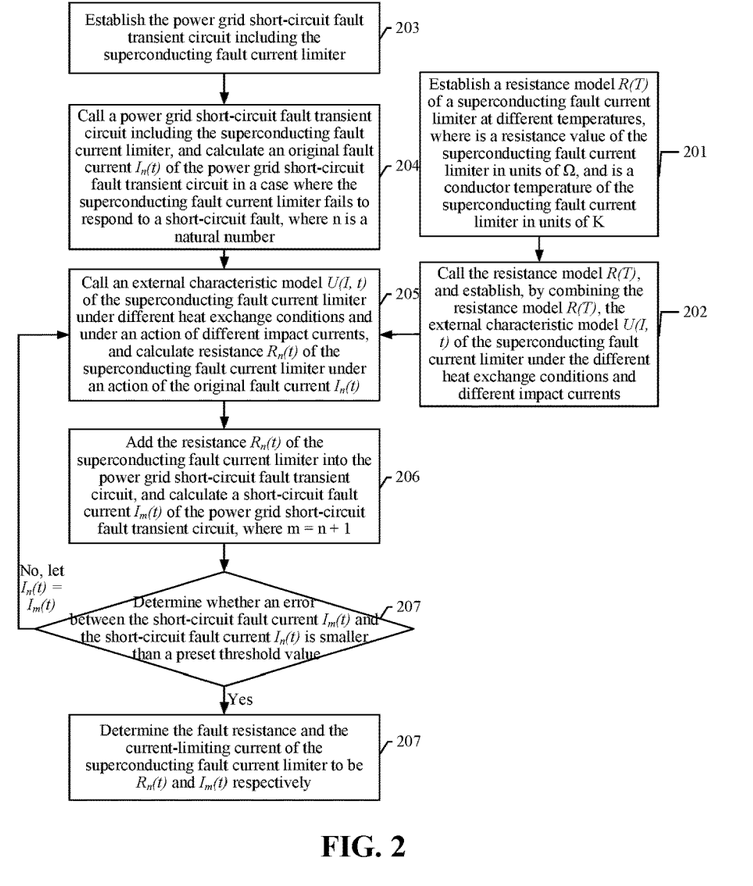
FIG. 2 illustrates a flowchart of a method for calculating fault resistance and a current-limiting current of a superconducting fault current limiter according to another embodiment of the present disclosure.

Referring to FIG. 2, a method for calculating fault resistance and a current-limiting current of a superconducting fault current limiter is provided in another embodiment of the present disclosure and includes steps described below.

Step 201: A resistance model R(T) of the superconducting fault current limiter at different temperatures is established, where R is a resistance value of the superconducting fault current limiter in units of Ω, and T is a conductor temperature of the superconducting fault current limiter in units of K.

It is to be noted that a resistance model R(T) of the superconducting fault current limiter at different temperatures is established by using mathematical analysis software such as MATLAB software, where R is a resistance value of the superconducting fault current limiter in units of Ω, and T is a conductor temperature of the superconducting fault current limiter in units of K.

Step 202: The resistance model R(T) is called, and the external characteristic model U(I, t) of the superconducting fault current limiter under the different heat exchange conditions and different impact currents is established by combining the resistance model R(T).

It is to be noted that the external characteristic model U(I, t) of the superconducting fault current limiter under the different heat exchange conditions and different impact currents is established by using finite element simulation software such as ANSYS software. U is a terminal voltage of the superconducting fault current limiter, and I is a current flowing through the superconducting fault current limiter. The parameters of the physical model in the modeling are based on the resistance model R(T) established in the step 201.

Step 203: The power grid short-circuit fault transient circuit including the superconducting fault current limiter is established.

It is to be noted that the power grid short-circuit fault transient circuit including the superconducting fault current limiter is established by using power system simulation software such as PSCAD/EMTDC software.

Step 204: A power grid short-circuit fault transient circuit including the superconducting fault current limiter is called, and a first short-circuit fault current $I_n(t)$ of the power grid short-circuit fault transient circuit in a case where the superconducting fault current limiter fails to respond to a short-circuit fault is calculated, where n is a natural number.

Figure 5:
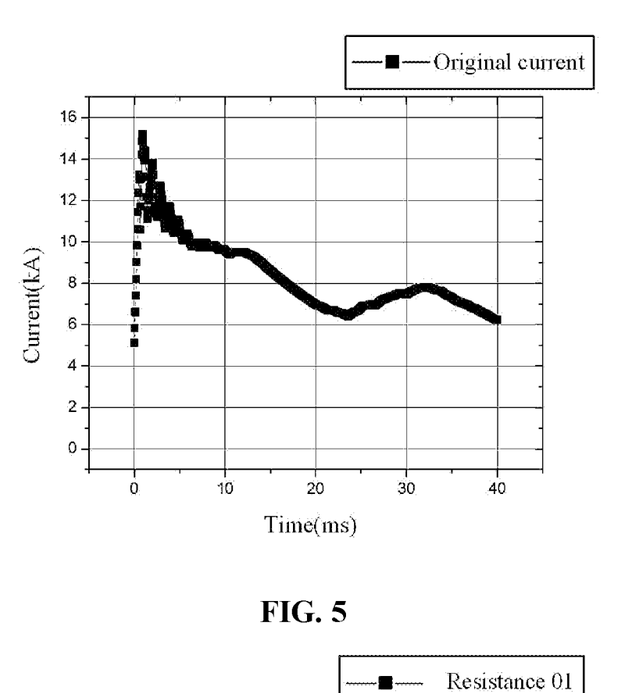
FIG. 5 illustrates a graph in which a first short-circuit fault current $I_0(t)$ varies with time.

It is to be noted that the power grid short-circuit fault transient circuit including the superconducting fault current limiter is established, and then called to provide the first short-circuit fault current $I_n(t)$ in the case where the superconducting fault current limiter fails to respond to the short-circuit fault, where n is a natural number. In the embodiment, n is equal to 0, and the first short-circuit fault current $I_0(t)$ illustrated in FIG. 5 is obtained.

Step 205: An external characteristic model U(I, t) of the superconducting fault current limiter under different heat exchange conditions and under an action of different impact currents is called, and resistance $R_n(t)$ of the superconducting fault current limiter under an action of the first short-circuit fault current $I_n(t)$ is calculated.

Figure 6:
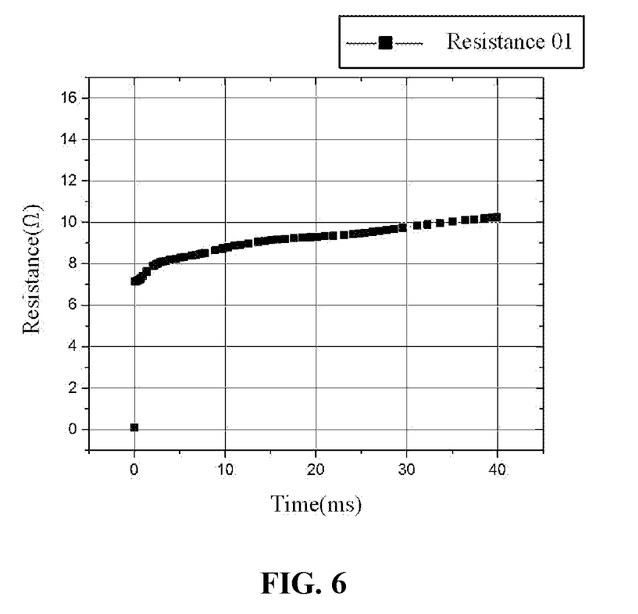
FIG. 6 illustrates a graph in which resistance $R_0(t)$ varies with time.
Figure 7:
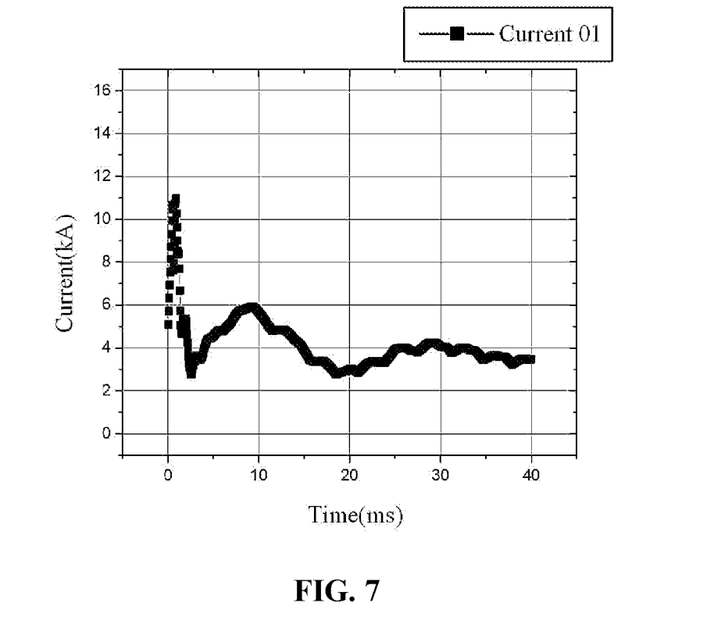
FIG. 7 illustrates a graph in which a short-circuit fault current $I_1(t)$ varies with time.
Figure 8:
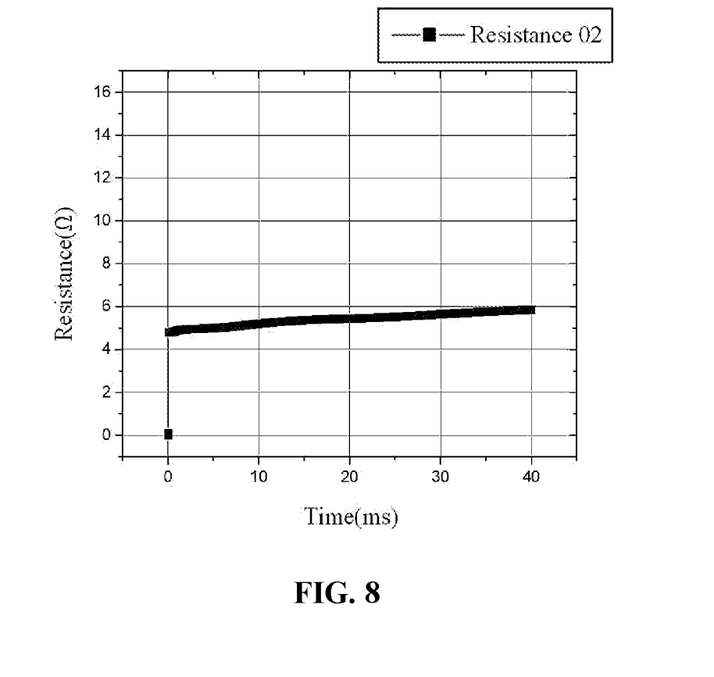
FIG. 8 illustrates a graph in which resistance $R_1(t)$ varies with time.
Figure 9:
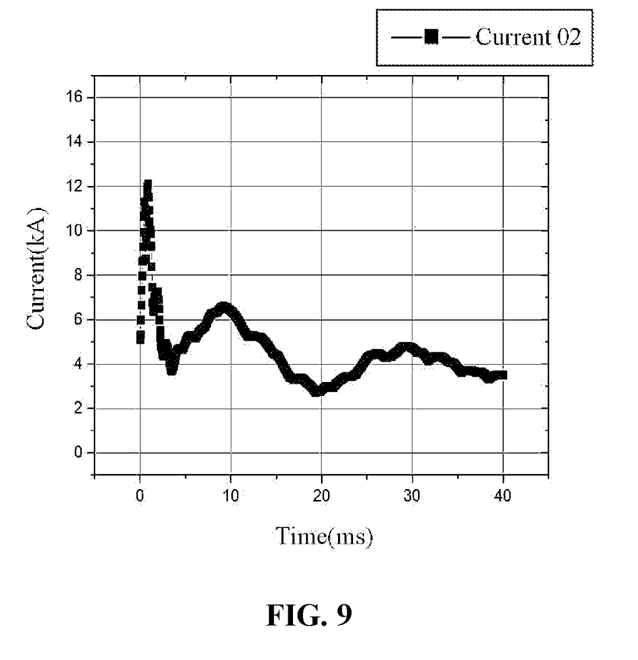
FIG. 9 illustrates a graph in which a short-circuit fault current $I_2(t)$ varies with time.
Figure 10:
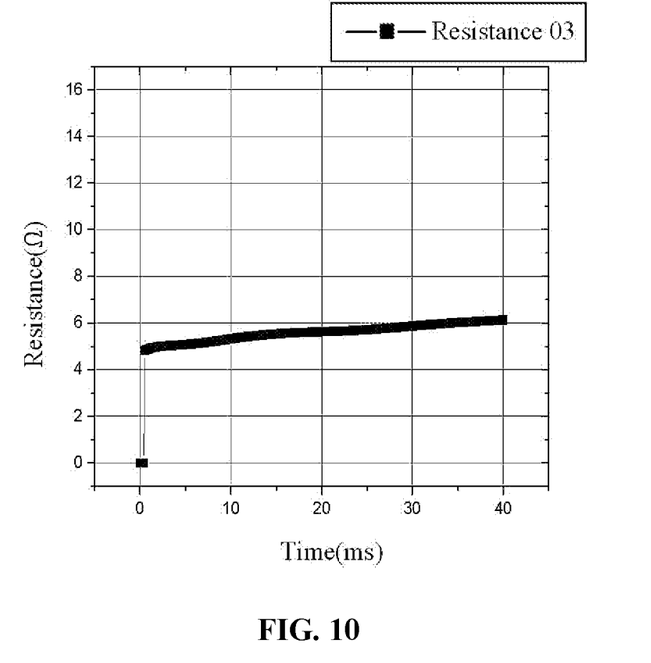
FIG. 10 illustrates a graph in which resistance $R_2(t)$ varies with time.
Figure 11:
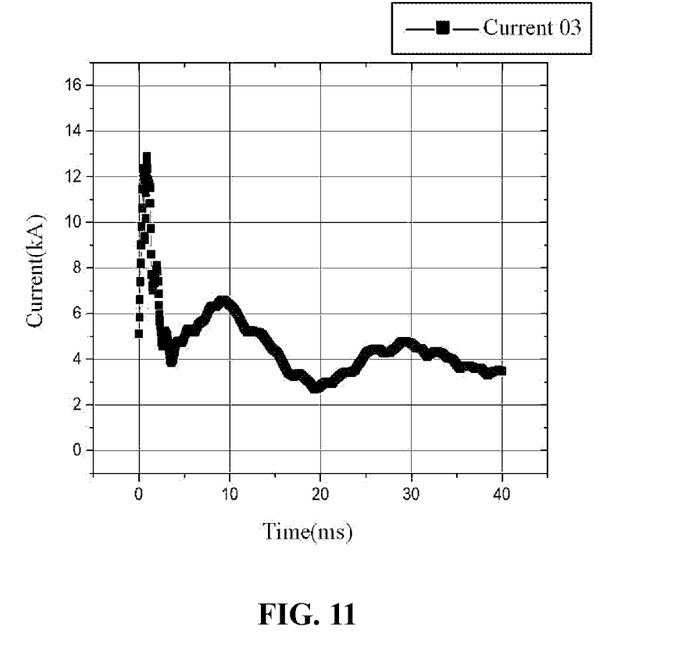
FIG. 11 illustrates a graph in which a short-circuit fault current $I_3(t)$ varies with time.

It is to be noted that the graph $U_1(I_0, t)$ in which voltage-current varies with time of the superconducting fault current limiter under the action of the first short-circuit fault current $I_n(t)$ can be calculated by calling the external characteristic model $U(I, t)$ of the superconducting fault current limiter under different heat exchange conditions and under an action of different impact currents, and thus resistance $R_0(t)$ of the superconducting fault current limiter as illustrated in FIG. 6 can be calculated and obtained.

Step 206: The resistance $R_n(t)$ of the superconducting fault current limiter is added into the power grid short-circuit fault transient circuit, and a second short-circuit fault current $I_m(t)$ of the power grid short-circuit fault transient circuit is calculated, where m=n+1.

It is to be noted that the resistance $R_n(t)$ of the superconducting fault current limiter is calculated and obtained, and then used to replace the resistance in the power grid short-circuit fault transient circuit including the superconducting fault current limiter, so that the second short-circuit fault current $I_m(t)$ of the power grid short-circuit fault transient circuit is calculated, where m=n+1.

Step 207: It is determined whether an error $$\frac{|I_m(t) - I_n(t)|}{|I_n(t)|}$$

between the second short-circuit fault current $I_m(t)$ and the first short-circuit fault current $I_n(t)$ is smaller than a preset threshold value, if yes, the fault resistance and the current-limiting current of the superconducting fault current limiter are determined to be $R_n(t)$ and $I_m(t)$ respectively; and if not, after $I_n(t)=I_m(t)$, the process returns to the step 205 for iteration.

It is to be noted that after the second short-circuit fault current $I_m(t)$ is obtained, it is determined whether the error $$\frac{|I_m(t) - I_n(t)|}{|I_n(t)|}$$

between the second short-circuit fault current $I_m(t)$ and the first short-circuit fault current $I_n(t)$ is smaller than the preset threshold value.

A superconducting current limiting unit is a core component of the resistive type superconducting fault current limiter. When a short-circuit fault current impacts the power grid, the change process of the superconducting current limiting unit from a superconducting state through a magnetic flux resistance state to a complete quench state determines the operation performance of the whole resistive type superconducting fault current limiter. As shown in FIGS. 5 to 11, the transition of the superconducting fault current limiting unit is a strongly nonlinear feature closely related to the waveform and duration of the curve of the short-circuit fault current. That is, an increase in a short-circuit fault current I will urge the current limiting unit to generate resistance R, while the increase in the resistance R will inhibit the increase of the short-circuit fault current I; the short-circuit fault current I, which is smaller than expected, will reduce the generated heat Q, and the reduction in the accumulation rate of the heat Q will reduce the growth rate of the resistance R, thus acting on the magnitude of the short-circuit fault current I. Under the mutual influence of these factors, the final basis for determining the fault resistance and current-limiting current of the superconducting fault current limiter is that the difference between a previous short-circuit fault current and a subsequent short-circuit fault current is smaller than the preset threshold value, which means that the whole system tends to be stable. At this time, the fault resistance and current-limiting current of the superconducting fault current limiter can be determined separately.

The above is a description of the method for calculating fault resistance and a current-limiting current of a superconducting fault current limiter in another embodiment of the present disclosure, and the following is a description of an apparatus for calculating fault resistance and a current-limiting current of a superconducting fault current limiter in an embodiment of the present disclosure.

Figure 3:
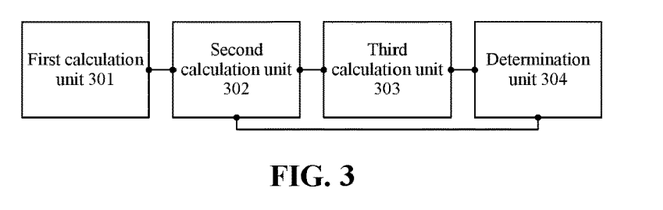
FIG. 3 illustrates a structure diagram of an apparatus for calculating fault resistance and a current-limiting current of a superconducting fault current limiter according to an embodiment of the present disclosure.

Referring to FIG. 3, an apparatus for calculating fault resistance and a current-limiting current of a superconducting fault current limiter is provided in an embodiment of the present disclosure and includes a first calculation unit 301, a second calculation unit 302, a third calculation unit 303, and a determination unit 304.

The first calculation unit 301 is configured to call a power grid short-circuit fault transient circuit including the superconducting fault current limiter, and calculate a first short-circuit fault current $I_n(t)$ of the power grid short-circuit fault transient circuit in a case where the superconducting fault current limiter fails to respond to a short-circuit fault, where n is a natural number.

The second calculation unit 302 is configured to call an external characteristic model $U(I, t)$ of the superconducting fault current limiter under different heat exchange conditions and under an action of different impact currents, and calculate resistance $R_n(t)$ of the superconducting fault current limiter under an action of the first short-circuit fault current $I_n(t)$.

The third calculation unit 303 is configured to add the resistance $R_n(t)$ of the superconducting fault current limiter into the power grid short-circuit fault transient circuit, and calculate a second short-circuit fault current $I_m(t)$ of the power grid short-circuit fault transient circuit, where m=n+1.

The determination unit 304 is configured to determine whether an error between the second short-circuit fault current $I_m(t)$ and the first short-circuit fault current $I_n(t)$ is smaller than a preset threshold value, if yes, determine the fault resistance and the current-limiting current of the superconducting fault current limiter to be $R_n(t)$ and $I_m(t)$ respectively; and if not, after $I_n(t)=I_m(t)$, determine to return to the second calculation unit 302 for iteration.

The above is a description of the apparatus for calculating fault resistance and a current-limiting current of a superconducting fault current limiter in an embodiment of the present disclosure, and the following is a description of an apparatus for calculating fault resistance and a current-limiting current of a superconducting fault current limiter in another embodiment of the present disclosure.

Figure 4:
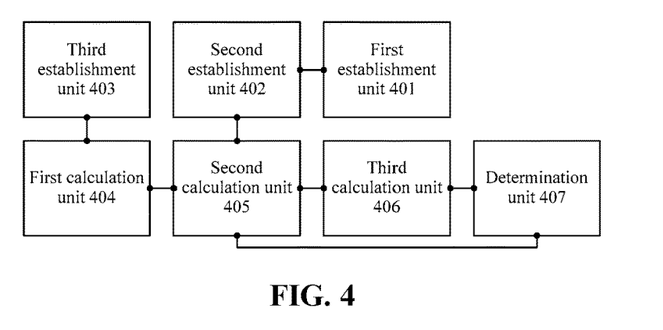
FIG. 4 illustrates a structure diagram of an apparatus for calculating fault resistance and a current-limiting current of a superconducting fault current limiter according to another embodiment of the present disclosure.

Referring to FIG. 4, an apparatus for calculating fault resistance and a current-limiting current of a superconducting fault current limiter is provided in another embodiment of the present disclosure and includes a first establishment unit 401, a second establishment unit 402, a third establishment unit 403, a first calculation unit 404, a second calculation unit 405, a third calculation unit 406, and a determination unit 407.

The first establishment unit 401 is configured to establish a resistance model R(T) of the superconducting fault current limiter at different temperatures, where R is a resistance value of the superconducting fault current limiter in units of Ω, and T is a conductor temperature of the superconducting fault current limiter in units of K.

The second establishment unit 402 is configured to call the resistance model R(T), and establish, by combining the resistance model R(T), the external characteristic model U(I, t) of the superconducting fault current limiter under the different heat exchange conditions and different impact currents.

The third establishment unit 403 is configured to establish a power grid short-circuit fault transient circuit including the superconducting fault current limiter.

The first calculation unit 404 is configured to call the power grid short-circuit fault transient circuit including the superconducting fault current limiter, and calculate a first short-circuit fault current $I_n(t)$ of the power grid short-circuit fault transient circuit in a case where the superconducting fault current limiter fails to respond to a short-circuit fault, where n is a natural number.

The second calculation unit 405 is configured to call an external characteristic model U(I, t) of the superconducting fault current limiter under different heat exchange conditions and under an action of different impact currents, and calculate resistance $R_n(t)$ of the superconducting fault current limiter under an action of the first short-circuit fault current $I_n(t)$.

The third calculation unit 406 is configured to add the resistance $R_n(t)$ of the superconducting fault current limiter into the power grid short-circuit fault transient circuit, and calculate a second short-circuit fault current $I_m(t)$ of the power grid short-circuit fault transient circuit, where m=n+1.

The determination unit 407 is configured to determine whether an error $$\frac{|I_m(t) - I_n(t)|}{|I_n(t)|}$$

between the second short-circuit fault current $I_m(t)$ and the first short-circuit fault current $I_n(t)$ is smaller than a preset threshold value, if yes, determine the fault resistance and the current-limiting current of the superconducting fault current limiter to be $R_n(t)$ and $I_m(t)$ respectively; and if not, after $I_n(t)=I_m(t)$, determine to return to the second calculation unit 405 for iteration.

A device for calculating fault resistance and a current-limiting current of a superconducting fault current limiter is provided in the present disclosure, and includes a processor and a memory.

The memory is configured to store program codes and transmit the program codes to the processor.

The processor is configured to execute the method for calculating fault resistance and a current-limiting current of a superconducting fault current limiter in either embodiment one or embodiment two according to instructions in the program codes.

A computer-readable storage medium is provided in the present disclosure, and is configured to store program codes for executing the method for calculating fault resistance and a current-limiting current of a superconducting fault current limiter in either embodiment one or embodiment two.

It will be apparent to those skilled in the art that to describe conveniently and briefly, for specific processes of operation of the systems, apparatuses, and units, reference may be made to corresponding processes in the method embodiments, and repetition will not be made here.

It is to be understood that the systems, apparatuses, and methods disclosed in the embodiments of the present application may be implemented in other manners. For example, the apparatus embodiments described above are merely illustrative. For example, a unit division is merely a logical function division, and, in practice, the unit division may be implemented in other ways. For example, multiple units or components may be combined or may be integrated into another system, or some features may be ignored or not executed. Additionally, the presented or discussed mutual coupling, direct coupling, or communication connections may be indirect coupling or communication connections via interfaces, apparatuses or units, or may be electrical, mechanical or in other forms.

The units described as separate components may or may not be physically separated. Components presented as units may or may not be physical units, i.e., may be located in one place or may be distributed on multiple network units. Part or all of these units may be selected according to practical requirements.

Additionally, various functional units in each embodiment of the present disclosure may be integrated into one processing unit, or each unit may be physically presented separately, or two or more units may be integrated into one unit. The integrated unit may be implemented by hardware or implemented in the form of a software functional unit.

The integrated unit may be stored in a computer-readable storage medium if implemented in the form of the software functional unit and sold or used as an independent product. Based on this understanding, the provided by the present disclosure substantially, the part contributing to the existing art, or all or part of the schemes may be embodied in the form of a software product. The computer software product is stored in a storage medium and includes several instructions for enabling a computer device (which may be a personal computer, a server, a network device or the like) to execute all or part of the steps in the methods provided by the embodiments of the present disclosure. The storage medium includes a USB flash disk, a mobile hard disk, a read-only memory (ROM), a random access memory (RAM), a magnetic disk, an optical disk or another medium capable of storing program codes.

What is claimed is:

1. A method for calculating fault resistance and a current-limiting current of a superconducting fault current limiter, comprising:
   step S1: calling a power grid short-circuit fault transient circuit including the superconducting fault current limiter, and calculating a first short-circuit fault current $I_n(t)$ of the power grid short-circuit fault transient circuit in a case where the superconducting fault current limiter fails to respond to a short-circuit fault, wherein n is a natural number;
   step S2: calling an external characteristic model U(I, t) of the superconducting fault current limiter under different heat exchange conditions and under an action of different impact currents, and calculating resistance $R_n(t)$ of the superconducting fault current limiter under an action of the first short-circuit fault current $I_n(t)$;
   step S3: adding the resistance $R_n(t)$ of the superconducting fault current limiter into the power grid short-circuit fault transient circuit, and calculating a second short-circuit fault current $I_m(t)$ of the power grid short-circuit fault transient circuit, wherein m=n+1; and step S4: determining whether an error between the second short-circuit fault current $I_m(t)$ and the first short-circuit fault current $I_n(t)$ is smaller than a preset threshold value, if yes, determining the fault resistance and the current-limiting current of the superconducting fault current limiter to be $R_n(t)$ and $I_m(t)$ respectively; and if not, after $I_n(t)=I_m(t)$, returning to the step S2 for iteration.

2. The method for calculating fault resistance and a current-limiting current of a superconducting fault current limiter of claim 1, further comprising: before the step S1,
step S01: establishing a resistance model $R(T)$ of the superconducting fault current limiter at different temperatures, wherein R is a resistance value of the superconducting fault current limiter in units of $\Omega$, and T is a conductor temperature of the superconducting fault current limiter in units of K; and
step S02: calling the resistance model $R(T)$, and establishing, by combining the resistance model $R(T)$, the external characteristic model $U(I, t)$ of the superconducting fault current limiter under the different heat exchange conditions and different impact currents.

3. The method for calculating fault resistance and a current-limiting current of a superconducting fault current limiter of claim 1, further comprising: before the step S1,
establishing the power grid short-circuit fault transient circuit including the superconducting fault current limiter.

4. The method for calculating fault resistance and a current-limiting current of a superconducting fault current limiter of claim 1, wherein the error between the second short-circuit fault current $I_m(t)$ and the first short-circuit fault current $I_n(t)$ in the step S4 is specifically expressed by:

$$\frac{|I_m(t) - I_n(t)|}{|I_n(t)|}.$$

5. A device for calculating fault resistance and a current-limiting current of a superconducting fault current limiter, comprising a processor and a memory;
wherein the memory is configured to store program codes and transmit the program codes to the processor; and
the processor is configured to execute the program codes to perform following steps:
Step S1: calling a power grid short-circuit fault transient circuit including the superconducting fault current limiter, and calculating a first short-circuit fault current $I_n(t)$ of the power grid short-circuit fault transient circuit in a case where the superconducting fault current limiter fails to respond to a short-circuit fault is calculated, where n is a natural number;
Step S2: calling an external characteristic model $U(I, t)$ of the superconducting fault current limiter under different heat exchange conditions and under an action of different impact currents, and calculating resistance $R_n(t)$ of the superconducting fault current limiter under an action of the first short-circuit fault current $I_n(t)$;
Step S3: adding the resistance $R_n(t)$ of the superconducting fault current limiter into the power grid short-circuit fault transient circuit, and calculating a second short-circuit fault current $I_m(t)$ of the power grid short-circuit fault transient circuit, where m=n+1; and
Step S4: determining whether an error between the second short-circuit fault current $I_m(t)$ and the first short-circuit fault current $I_n(t)$ is smaller than a preset threshold value, if yes, determining the fault resistance and the current-limiting current of the superconducting fault current limiter to be $R_n(t)$ and $I_m(t)$ respectively; and if not, after $I_n(t)=I_m(t)$, returning to the step S2 for iteration.

6. A non-transitory computer-readable storage medium, which is configured to store program codes for executing the method for calculating fault resistance and a current-limiting current of a superconducting fault current limiter, wherein the method comprises:
Step S1: calling a power grid short-circuit fault transient circuit including the superconducting fault current limiter, and calculating a first short-circuit fault current $I_n(t)$ of the power grid short-circuit fault transient circuit in a case where the superconducting fault current limiter fails to respond to a short-circuit fault is calculated, where n is a natural number;
Step S2: calling an external characteristic model $U(I, t)$ of the superconducting fault current limiter under different heat exchange conditions and under an action of different impact currents, and calculating resistance $R_n(t)$ of the superconducting fault current limiter under an action of the first short-circuit fault current $I_n(t)$;
Step S3: adding the resistance $R_n(t)$ of the superconducting fault current limiter into the power grid short-circuit fault transient circuit, and calculating a second short-circuit fault current $I_m(t)$ of the power grid short-circuit fault transient circuit, where m=n+1; and
Step S4: determining whether an error between the second short-circuit fault current $I_m(t)$ and the first short-circuit fault current $I_n(t)$ is smaller than a preset threshold value, if yes, determining the fault resistance and the current-limiting current of the superconducting fault current limiter to be $R_n(t)$ and $I_m(t)$ respectively; and if not, after $I_n(t)=I_m(t)$, returning to the step S2 for iteration.

7. The device for calculating fault resistance and a current-limiting current of a superconducting fault current limiter of claim 5, wherein the processor is further configured to perform following steps:
step S01: establishing a resistance model $R(T)$ of the superconducting fault current limiter at different temperatures, wherein R is a resistance value of the superconducting fault current limiter in units of $\Omega$, and T is a conductor temperature of the superconducting fault current limiter in units of K; and
step S02: calling the resistance model $R(T)$, and establishing, by combining the resistance model $R(T)$, the external characteristic model $U(I, t)$ of the superconducting fault current limiter under the different heat exchange conditions and different impact currents.

8. The device for calculating fault resistance and a current-limiting current of a superconducting fault current limiter of claim 5, wherein the processor is further configured to perform a following step:
establishing the power grid short-circuit fault transient circuit including the superconducting fault current limiter.

9. The device for calculating fault resistance and a current-limiting current of a superconducting fault current limiter of claim 5, wherein the error between the second short-circuit fault current $I_m(t)$ and the first short-circuit fault current $I_n(t)$ in the step S4 is specifically expressed by:

$$\frac{|I_m(t) - I_n(t)|}{|I_n(t)|}.$$

10. The non-transitory computer-readable storage medium of claim 6, wherein the method further comprises: before the step S1,
- step S01: establishing a resistance model R(T) of the superconducting fault current limiter at different temperatures, wherein R is a resistance value of the superconducting fault current limiter in units of Ω, and T is a conductor temperature of the superconducting fault current limiter in units of K; and
- step S02: calling the resistance model R(T), and establishing, by combining the resistance model R(T), the external characteristic model U(I, t) of the superconducting fault current limiter under the different heat exchange conditions and different impact currents.

11. The non-transitory computer-readable storage medium of claim 6, wherein the method further comprises: before the step S1,
- establishing the power grid short-circuit fault transient circuit including the superconducting fault current limiter.

12. The non-transitory computer-readable storage medium of claim 6, wherein the error between the second short-circuit fault current $I_m(t)$ and the first short-circuit fault current $I_n(t)$ in the step S4 is specifically expressed by:

$$\frac{|I_m(t) - I_n(t)|}{|I_n(t)|}.$$

* * * * *